United States Patent
Pfizenmayer

Patent Number: 6,163,063
Date of Patent: Dec. 19, 2000

[54] SEMICONDUCTOR DEVICE

[75] Inventor: Henry L. Pfizenmayer, Phoenix, Ariz.

[73] Assignee: Motorola, Inc., Schaumburg, Ill.

[21] Appl. No.: 09/557,502

[22] Filed: Apr. 24, 2000

Related U.S. Application Data

[62] Division of application No. 09/088,019, Jun. 1, 1998.

[51] Int. Cl.[7] .................................................. H01L 29/00
[52] U.S. Cl. .............................. 257/529; 257/48; 257/209
[58] Field of Search ................................ 257/48, 209, 529

[56] References Cited

U.S. PATENT DOCUMENTS

| | | | |
|---|---|---|---|
| 4,933,898 | 6/1990 | Gilberg et al. | 365/53 |
| 5,331,195 | 7/1994 | Yukihiro | 257/529 |
| 5,382,831 | 1/1995 | Atakov et al. | 257/767 |
| 5,410,163 | 4/1995 | Murakami | 257/48 |
| 5,530,277 | 6/1996 | Otsuki et al. | 257/378 |
| 5,710,538 | 1/1998 | Zinn et al. | 338/195 |
| 5,780,921 | 7/1998 | Mitsuishi | 257/578 |

Primary Examiner—J. Carroll
Attorney, Agent, or Firm—A. Kate Huffman

[57] ABSTRACT

A semiconductor device (10) is formed to have multiple external connection pads (17, 18) for an active element (12). The multiple external connection pads (17, 18) are electrically connected together with a electrical link (19). After testing, the electrical link (19) is removed to disconnect the multiple external connection pads (17, 18) from each other.

5 Claims, 1 Drawing Sheet

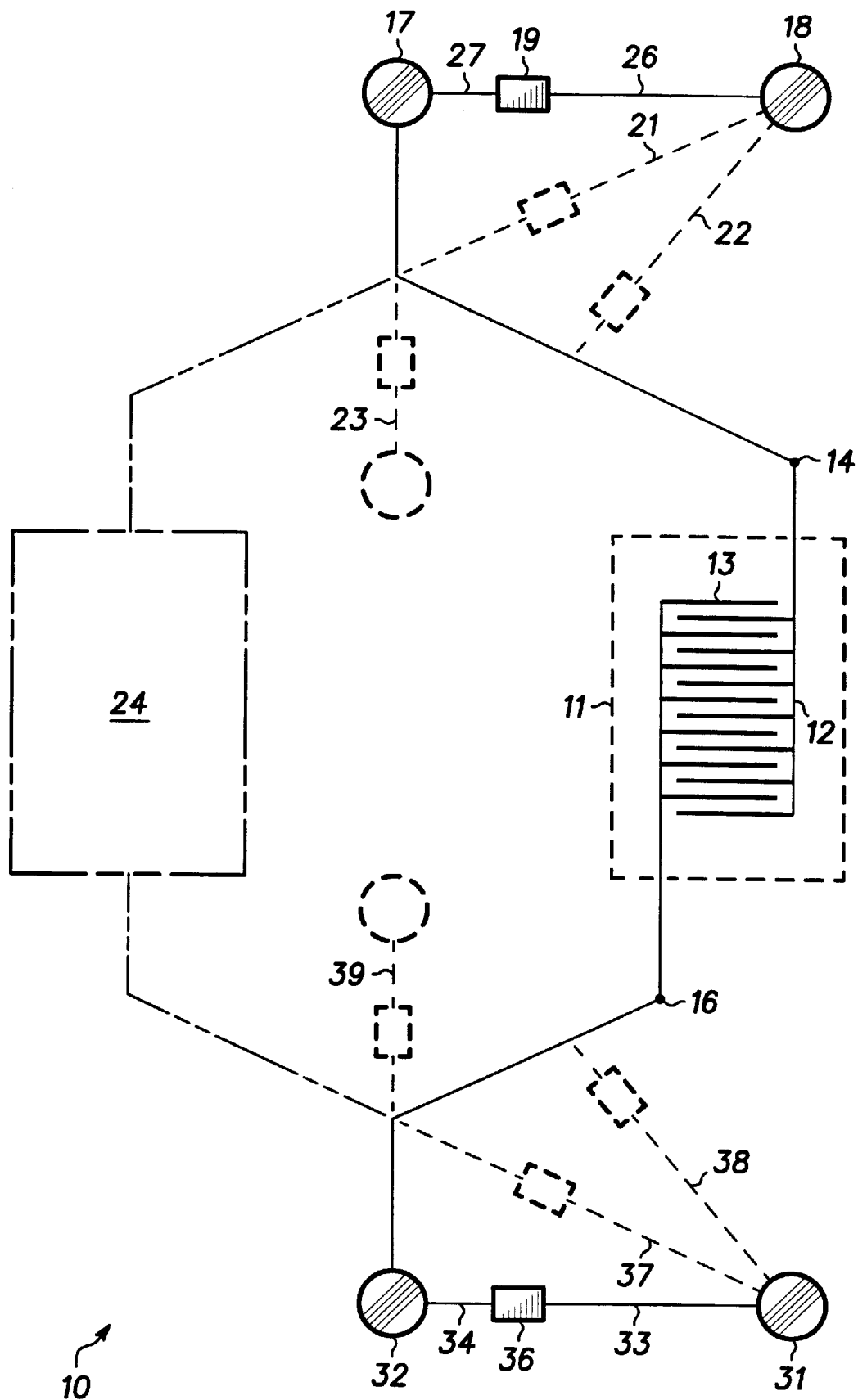

SEMICONDUCTOR DEVICE

This application is a division of Ser. No. 09/088,019 filing date Jun. 1, 1998.

BACKGROUND OF THE INVENTION

The present invention relates, in general, to semiconductors, and more particularly, to a novel semiconductor device and method.

During the manufacturing of semiconductor devices and especially those having high performance radio frequency (RF) transistors, it is often necessary to test the resistance of the device structure including the resistance of active elements or contacts of the RF transistor in order to ensure that the transistor meets certain specifications. One common technique for testing these parameters is Kelvin probing of the transistor. Kelvin probing requires the placement of two probes on one electrical conductor in order to force a particular current and measure the voltage derived from such current. One problem with this technique is the large bonding pad area that is required to accommodate the Kelvin probes. Large bonding pads increase capacitance thereby degrading the performance of the RF transistor. Typically, bonding pads are required to be at least 100 microns in diameter in order to accommodate both Kelvin probes.

Accordingly, it is desirable to have a method of testing a semiconductor device that does not require large bond pads, and that reduces the capacitance associated with the device that is being tested.

BRIEF DESCRIPTION OF THE DRAWING

The sole FIGURE schematically illustrates a portion of a semiconductor device in accordance with the present invention.

DETAILED DESCRIPTION OF THE DRAWING

The sole FIGURE schematically illustrates a semiconductor device 10 that minimizes the capacitance associated with the electrodes of device 10. Device 10 has an active area 11 that includes a first active element 12 and a second active element 13. Active element 12 could be the active elements of a transistor such as an emitter for a bipolar transistor or a source of a metal oxide semiconductor (MOS) transistor. Element 13 could be another active element of the transistor such as a base or a gate. Elements 12 and 13 are electrically connected to nodes or terminals, such as terminals 14 and 16, which facilitate electrically connecting elements 12 and 13 to circuits external to device 10.

Device 10 is also formed to have a plurality of external connection pads such as a first external connection pad 17 and a second external connection pad 18. In the preferred embodiment, pads 17 and 18 are circular bonding pads of an RF transistor. As will be seen hereinafter, only pad 17 of this plurality of external connection pads is used to electrically connect device 10 to external circuits. Pads 17 and 18 are electrically connected together and also electrically connected to active elements, such as element 12 through terminal 14. Pad 18 is physically separated from pad 17 but is electrically connected to pad 17 through a first conductor 26, a second conductor 27, and an electrical link 19. First conductor 26 has one end connected to pad 18 and a second end connected to one end of link 19. Similarly, second conductor 27 has a first end connected to link 19 and a second end connected to pad 17 to form the electrical connection between pads 17 and 18.

Electrical link 19 typically is a fusible link such as a polysilicon fuse, a nichrome fuse, or other electrical link that can be used to electrically disconnect pad 17 from pad 18. Such electrical links are well known to those skilled in the semiconductor art. Activating link 19 typically involves supplying sufficient electrical current through link 19 to create an essentially open circuit. Link 19 is placed a sufficient distance from pad 17 to ensure that activating link 19 to remove the electrical connection between pads 17 and 18 does not disturb pad 17. Typically, link 19 is at least one hundred microns from pad 17. Pad 18 can be placed in a variety of locations and be electrically coupled through a variety of different paths as shown by dashed lines 21, 22, and 23. In the preferred embodiment, pad 18 is physically attached to pad 17. However in other embodiments, pad 18 may be physically attached to terminal 14 or other points along the conductor attached to element 12 but the accuracy of the measurements may be reduced.

Active element 13 also has a plurality of external connection pads that function similarly to pads 17 and 18. A third external connection pad 32 and a fourth external connection pad 31 function similarly to pads 17 and 18, respectively. Pad 31 is electrically connected to pad 32 via a third conductor 33, a second electrical link 36, and a fourth conductor 34. Conductors 33 and 34 are similar to conductors 26 and 27, respectively, and link 36 is similar to link 19. Pad 32 is connected to a terminal 16 that is similar to terminal 14.

Semiconductor device 10 may have a plurality of active areas that are similar to area 11 and connected to the external connection pads in parallel with area 11. Another such area is illustrated by a dashed box 24.

After manufacturing of device 10, Kelvin probing can be used to test device 10. One set of the Kelvin probe can have one probe placed on pad 17 and the second probe placed on pad 18. Another set of Kelvin probes can be placed on pads 31 and 32 thereby allowing testing of device 10. After the Kelvin probing is complete, an electrical current is passed between pads 17 and 18 to remove the electrical coupling between pads 17 and 18. Similarly, an electrical current is passed between pads 31 and 32 to remove the electrical coupling. After removing the electrical coupling of pad 18 to pad 17, the capacitance on pad 17 and thus on element 12 is reduced. Additionally, the size of the pads can be smaller than the pads for a prior art transistor since only one Kelvin probe is placed on a pad. In the preferred embodiment, the capacitance on element 12 is one fourth the capacitance of a prior art transistor. Once the electrical couplings are removed, only pads 17 and 32 are used to externally connect device 10 to external circuits.

By now it should be apparent that there has been provided a novel method of forming a semiconductor device and structure therefore. By connecting multiple pads to one electrode of a semiconductor device and coupling the multiple pads by an electrical link allows testing the semiconductor device. Removing the electrical coupling between the multiple pads reduces the capacitance on the semiconductor device thereby improving the performance while still allowing the semiconductor device to be tested.

What is claimed is:

1. A semiconductor device comprising:

a terminal suitable for coupling externally to the semiconductor device, the semiconductor being devoid of a monitoring circuit;

a first external connection pad electrically coupled to the terminal;

a second external connection pad having a first conductor coupled thereto;

an electrical link having one end electrically coupled to the first conductor and a second end that is electrically disconnected from the first external connection pad; and a second conductor coupled to the second end of the electrical link wherein the second conductor is electrically coupled to the first external connection pad wherein capacitance on the terminal is reduced.

2. The semiconductor device of claim 1 wherein the first external connection pad includes a first bonding pad and the second external connection pad includes a second bonding pad.

3. The semiconductor device of claim 1 wherein the electrical link is a fusible link.

4. The semiconductor device of claim 1 wherein the terminal is coupled to an electrode of a transistor.

5. The semiconductor device of claim 4 wherein the electrode of the transistor is one of a base electrode or an emitter electrode.

* * * * *